(12) United States Patent
Van Dal et al.

(10) Patent No.: US 11,574,927 B2
(45) Date of Patent: Feb. 7, 2023

(54) SEMICONDUCTOR DEVICES AND METHOD FOR MANUFACTURING THE SAME

(71) Applicant: TAIWAN SEMICONDUCTOR MANUFACTURING COMPANY, LTD., Hsinchu (TW)

(72) Inventors: Marcus Johannes Henricus Van Dal, Hsinchu (TW); Georgios Vellianitis, Hsinchu (TW); Gerben Doornbos, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/233,162

(22) Filed: Apr. 16, 2021

(65) Prior Publication Data

US 2022/0336477 A1    Oct. 20, 2022

(51) Int. Cl.

| H01L 29/78 | (2006.01) |
|---|---|
| H01L 29/40 | (2006.01) |
| H01L 27/1159 | (2017.01) |
| H01L 21/28 | (2006.01) |
| H01L 29/24 | (2006.01) |
| H01L 29/51 | (2006.01) |
| H01L 29/16 | (2006.01) |

(52) U.S. Cl.
CPC ......... *H01L 27/1159* (2013.01); *H01L 29/16* (2013.01); *H01L 29/24* (2013.01); *H01L 29/40111* (2019.08); *H01L 29/516* (2013.01); *H01L 29/78391* (2014.09)

(58) Field of Classification Search
CPC ..... H01L 27/1159; H01L 29/16; H01L 29/24; H01L 29/40111; H01L 29/516; H01L 29/78391
USPC ........................................................... 257/43
See application file for complete search history.

(56) References Cited

U.S. PATENT DOCUMENTS

| 9,853,150 | B1* | 12/2017 | Colinge | H01L 27/1159 |
|---|---|---|---|---|
| 9,911,847 | B1* | 3/2018 | Chin | H01L 29/40111 |
| 2015/0340372 | A1* | 11/2015 | Pandey | H01L 29/6684 257/295 |
| 2018/0166453 | A1* | 6/2018 | Muller | H01L 28/60 |
| 2018/0190338 | A1* | 7/2018 | Li | H01L 27/1159 |
| 2019/0019800 | A1* | 1/2019 | Yoo | H01L 29/513 |
| 2019/0237470 | A1* | 8/2019 | Mine | H01L 29/7827 |
| 2019/0378845 | A1* | 12/2019 | Kim | H01L 27/1159 |
| 2020/0055134 | A1* | 2/2020 | Heo | B23K 3/08 |
| 2020/0203381 | A1* | 6/2020 | Rabkin | H01L 29/16 |
| 2020/0227439 | A1* | 7/2020 | Sato | H01L 27/11587 |
| 2020/0303417 | A1* | 9/2020 | Teo | H01L 27/11585 |
| 2021/0264959 | A1* | 8/2021 | Rabkin | H01L 29/778 |

* cited by examiner

*Primary Examiner* — Sheikh Maruf

(74) *Attorney, Agent, or Firm* — Birch, Stewart, Kolasch & Birch, LLP

(57) ABSTRACT

A semiconductor device includes a gate electrode, a channel layer, and a ferroelectric layer. The ferroelectric layer includes a monocrystalline region located between the gate electrode and the channel layer to serve as a gate dielectric, and a polycrystalline region located at an edge of the gate electrode. A method for manufacturing the semiconductor device is also disclosed.

20 Claims, 19 Drawing Sheets ions are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

SEMICONDUCTOR DEVICES AND METHOD FOR MANUFACTURING THE SAME

BACKGROUND

The discovery of ferroelectricity in hafnium oxide (hafnia) based binary oxides (fluorite structure oxides) jump-started a new wave of intensive research on ferroelectric devices and, especially, FeFETs (ferroelectric field-effect transistors). There is a need for further improving performances of a ferroelectric device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
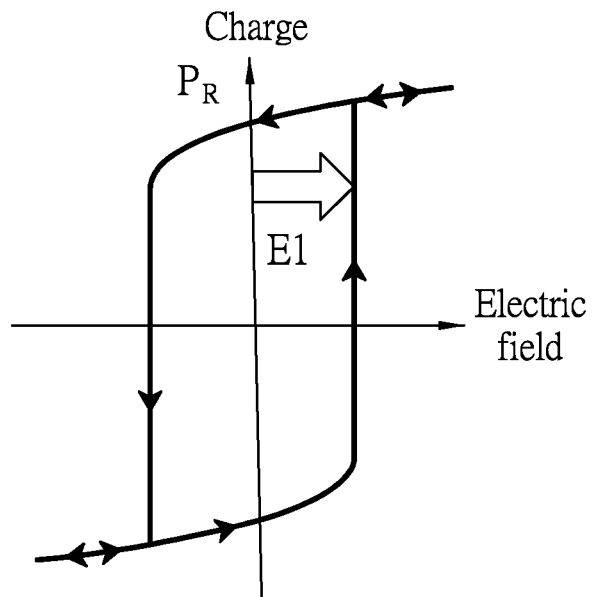
FIG. 1A is an ideal hysteresis loop of polarization of a ferroelectric material.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "low," "higher," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices and methods for manufacturing the same. The semiconductor devices may be used in, for example, but not limited to, a 20 nanometer (N20) generation device, a 16 nanometer (N16) generation device, a 10 nanometer (N10) generation device, or other generation devices. A semiconductor device contains a ferroelectric layer in a gate dielectric stack of a standard metal-oxide-semiconductor field-effect transistor (MOSFET), and may be viewed as a non-volatile memory element in which binary data are stored in the direction of ferroelectric polarization (up or down). The up and down polarization directions either assist in the formation of the inversion layer in the semiconductor channel or deplete it, resulting in opposite shifts in the threshold voltage of the semiconductor device. The non-volatility property makes the semiconductor device an attractive candidate for a wide range of new applications such as artificial intelligence (AI) to the Internet-of-Things (IoT) edge devices.

FIG. 1A illustrates an ideal hysteresis loop of polarization of a ferroelectric material. When the electric field is zero, the charge (the polarization) can have two states, depending on whether a semiconductor device (for example, an FeFET) is to be measured on the up or down trance. Therefore, the device may be used as a memory device. In an ideal FeFET, the polarization may flip as a whole at a fixed electric field (E1) to achieve remnant polarization ($P_R$).

Figure 1B:
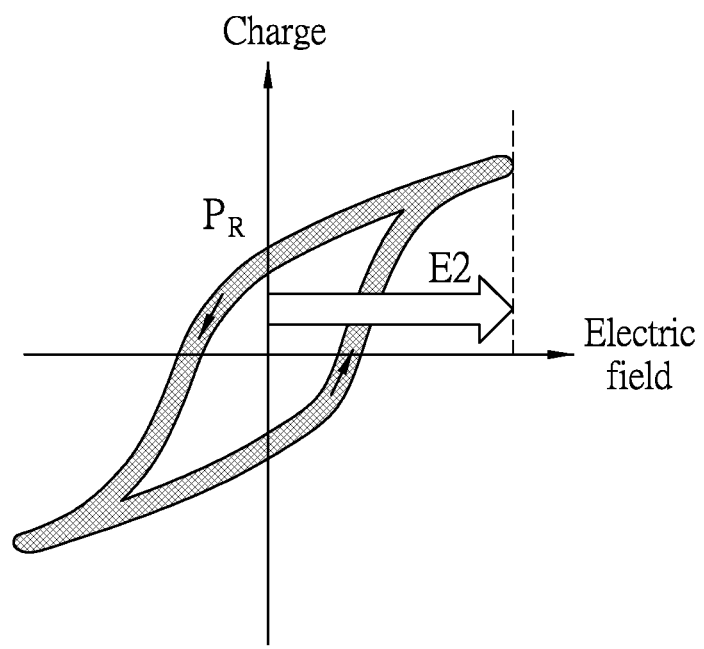
FIG. 1B is a typical hysteresis loop of polarization of a polycrystalline hafnia.

FIG. 1B illustrates a typical hysteresis loop of polarization of hafnia. Hafnia has polymorphic nature with 4 known phases (which are tetragonal, orthorhombic, monoclinic, and cubic). Moreover, hafnia typically forms a polycrystalline layer. Therefore, in a typical hafnia semiconductor device, the polarization switching may not happen at an exact given electric field but multiple polarization switching happens all at slightly different fields. In addition, to achieve remnant polarization ($P_R$), an electric field (E2) used for switching the typical hafnia semiconductor device is much higher than the fixed electric field (E1) used for switching the ideal FeFET.

Figure 2:
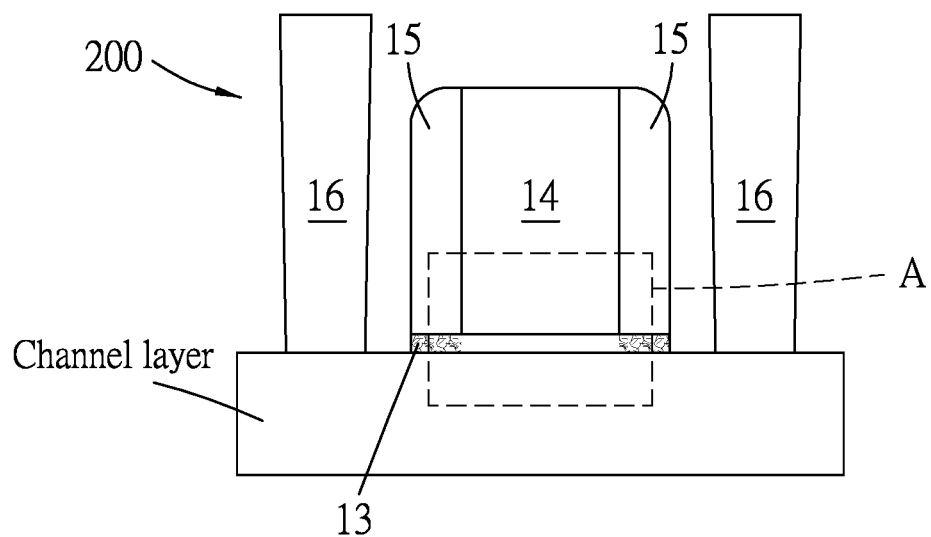
FIG. 2 is a schematic cross-sectional view illustrating a semiconductor device in accordance with some embodiments.
Figure 2A:
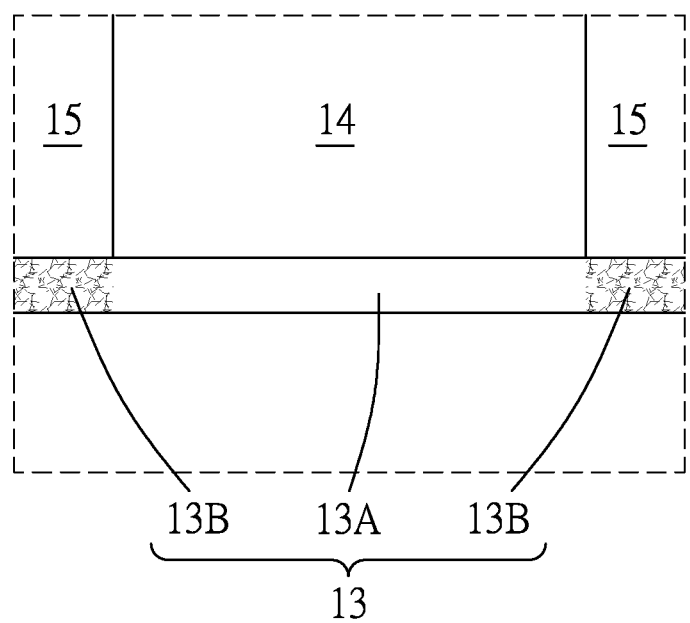
FIG. 2A is a partially enlarged view of FIG. 2.

FIG. 2 illustrates a schematic cross-sectional view of a semiconductor device 200 in accordance with some embodiments. FIG. 2A is an enlarged view of an area A in FIG. 2.

In the semiconductor device 200, (i) a single crystal ferroelectric gate dielectric (i.e., a monocrystalline region 13A of a ferroelectric layer 13) is provided between a channel layer (which may be a portion of a semiconductor substrate or a thin film channel) and a gate electrode 14 in order to achieve sharp polarization switching (as shown in FIG. 1A), and (ii) a polycrystalline ferroelectric material (i.e., two polycrystalline regions 13B of the ferroelectric layer 13) is provided at the edge of the gate electrode 14 to enhance the nucleation of the switching. Although this disclosure is not bound by any theory, it is believed that nucleation of the polarization flipping (which is actually a physical movement of oxygen atoms inside the crystal) serves to "kick start" flipping, and the polycrystalline ferroelectric material at the edge of the gate electrode 14 may help this nucleation and then the polarization switching propagates very quickly through the ferroelectric layer 13 (theoretically, the propagation should happen with the speed of sound). In some embodiments, the semiconductor device 200 may be a FeFET (ferroelectric field-effect transistor).

Figure 3:
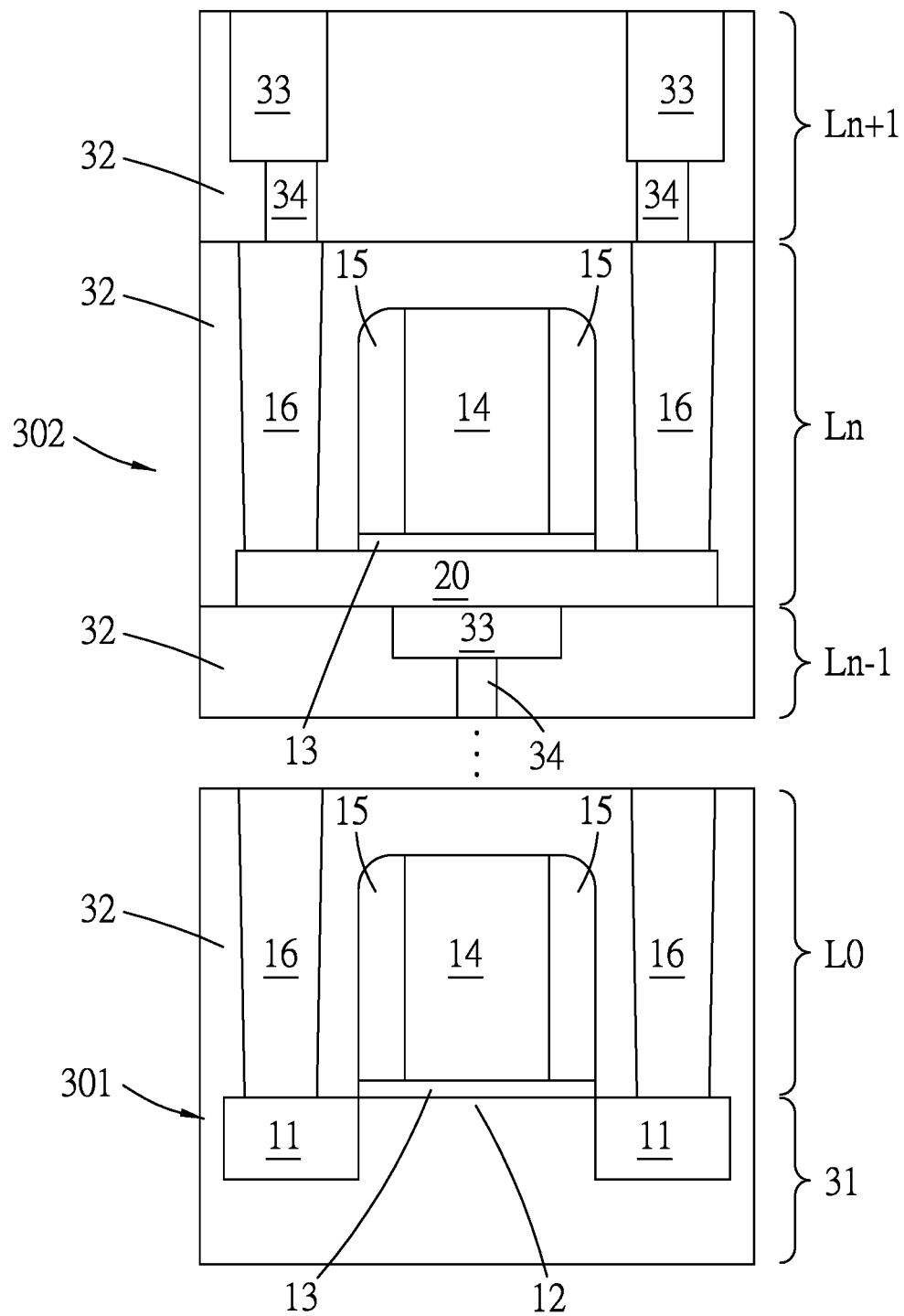
FIG. 3 is a schematic cross-sectional view illustrating an integrated circuit in accordance with some embodiments.

FIG. 3 is a schematic cross-sectional view illustrating an integrated circuit in accordance with some embodiments. In FIG. 3, a transistor 301 is a front-end-of-line (FEOL) transistor located in the FEOL, and a transistor 302 is a back-end-of-line (BEOL) transistor located in the BEOL, and may be or may not be located directly above the transistor 301. The semiconductor device 200 shown in FIG. 2 may be applied to one or both of the transistor 301 and the transistor 302. In the following, the transistor 301 and the transistor 302 are described with the semiconductor device 200 applied to both of them.

The transistor 301 may have two source/drain regions 11 formed in a semiconductor substrate 31, a channel region 12 located between the two source/drain regions 11, a ferroelectric layer 13 formed over the channel region 12 in a contact-level structure L0, a gate electrode 14 formed on a monocrystalline region 13A (see FIG. 2A) of the ferroelectric layer 13 in the contact-level structure L0, and two spacers 15 formed respectively on two polycrystalline regions 13B (see FIG. 2A) of the ferroelectric layer 13 at two opposite sides of the gate electrode 14. In the contact-level structure L0, source/drain contacts 16 may be formed in a dielectric layer 32 to be in electrical contact with the source/drain regions 11, respectively. In alternative embodiments, a contact (not shown) in the contact-level structure L0 may be formed to be in contact with the gate electrode 14 of the first transistor 301.

Furthermore, the transistor 302 may have similar elements as those of the transistor 301, and the similar elements are denoted by the same reference numbers. The transistor 302 may be formed in a dielectric layer 32 of an interconnect-level structure Ln. The transistor 302 may include a channel layer 20 formed to be connected to a metal line 33 and a contact via 34 in an interconnect-level structure Ln−1, a ferroelectric layer 13 formed on the channel layer 20, a gate electrode 14 formed on a monocrystalline region 13A (see FIG. 2A) of the ferroelectric layer 13, and two spacers 15 formed respectively on two polycrystalline regions 13B (see FIG. 2A) of the ferroelectric layer 13. In the interconnect-level structure Ln, two source/drain contacts 16 are formed in the dielectric layer 32 so as to permit the channel layer 20 to be in electrical contact with contact vias 34 and metal lines 33 in an interconnect-level structure Ln+1 through the source/drain contacts 16. In alternative embodiments, the interconnect-level structure Ln−1 may include only one of the contact via 34 and the metal line 33, and the interconnect-level structure Ln+1 may include only the two contact vias 34 or only the two metal lines 33. In yet alternative embodiments, a contact (not shown) may be formed in the interconnect-level structure Ln to bring the gate electrode 14 of the second transistor 302 into contact with a contact via (not shown) and/or a metal line (not shown) in the interconnect-level structure Ln+1.

Figure 4:
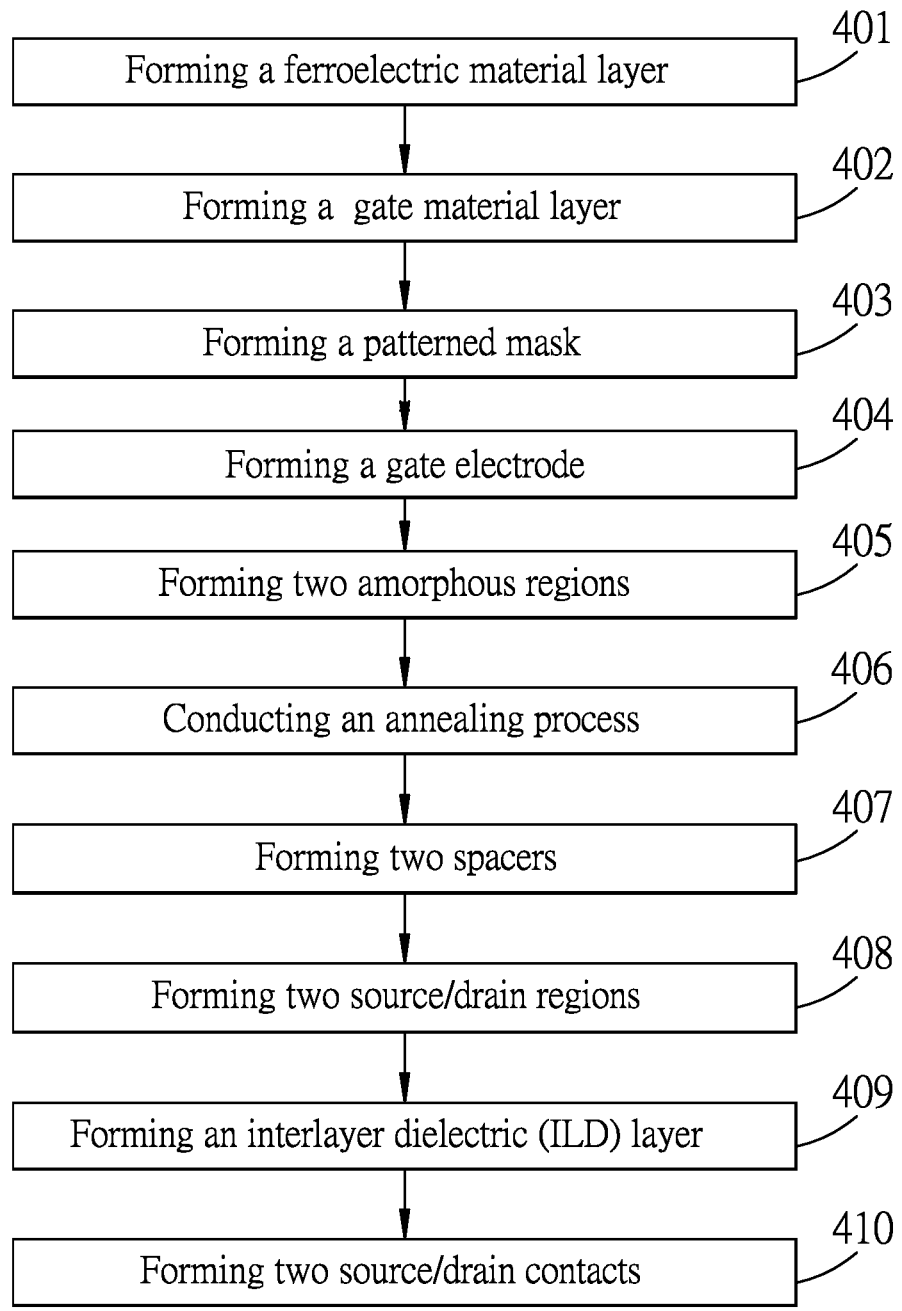
FIG. 4 is a flow diagram illustrating a method for manufacturing a semiconductor device in accordance with some embodiments.
Figure 5:
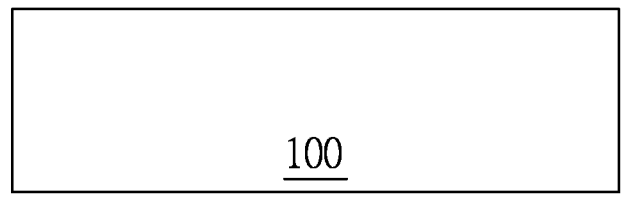
FIGS. 5 to 15 are schematic views illustrating intermediate stages of a method for manufacturing a semiconductor device in accordance with some embodiments as depicted in FIG. 3.

FIG. 4 is a flow diagram illustrating a method 400A for manufacturing a semiconductor device located in the FEOL (for example, the transistor 301 shown in FIG. 3) in accordance with some embodiments. FIGS. 5 to 15 illustrate schematic views of the intermediate stages of the method 400A. FIG. 5 illustrates a schematic view of a substrate 100 for formation of the semiconductor device located in the FEOL in accordance with some embodiments. The substrate 100 may include, for example, but not limited to, silicon. Other suitable semiconductor substrates are within the contemplated scope of the present disclosure. In some embodiments, the substrate 100 may correspond to the semiconductor substrate 31 shown in FIG. 3. In alternative embodiments, the substrate 100 may be an SOI (silicon-on-insulator) substrate, an SOS (silicon-on-sapphire) substrate, or other suitable substrates.

Figure 6:
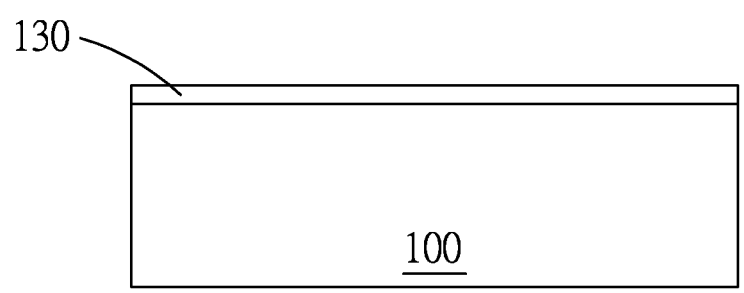

Referring to FIGS. 4 and 6, the method 400A begins at step 401, where a ferroelectric material layer 130 is formed on the substrate 100. The ferroelectric material layer 130 is monocrystalline, and may include binary oxides, ternary oxides, quaternary oxides, other suitable oxides, or combinations thereof. The binary oxides may include, for example, but not limited to, hafnium oxide (hafnia, $HfO_2$) or other suitable materials. The ternary oxides may include, for example, but not limited to, hafnium silicate ($HfSiO_x$), hafnium zirconate ($HfZrO_x$), $BaTiO_3$, $PbTiO_3$, $SrTiO_3$, $CaMnO_3$, $BiFeO_3$, AlScN, AlGaN, AlYN, doped $HfO_2$ (the dopants may include Y, Sc, Ga, Gd, combinations thereof, or other suitable dopants), other suitable materials, or combinations thereof. The quaternary oxides may include, for example, but not limited to, lead zirconate titanate ($PbZr_xTi_yO_z$), barium strontium titanate ($BaSrTiO_x$), $SrBi_2Ta_2O_9$, other suitable materials, or combinations thereof. Other suitable ferroelectric materials are within the contemplated scope of the present disclosure. The ferroelectric material layer 130 may be deposited by, for example, but not limited to, sputtering, chemical vapor deposition (CVD), physical vapor deposition (PVD), atomic layer deposition (ALD), plasma-enhanced ALD, molecular beam epitaxy (MBE), combinations thereof, or other suitable techniques. In some embodiments, the ferroelectric material layer 130 may be constructed in a single-layer form. In alternative embodiments, the ferroelectric material layer 130 may include a plurality of films with different materials.

Figure 7:
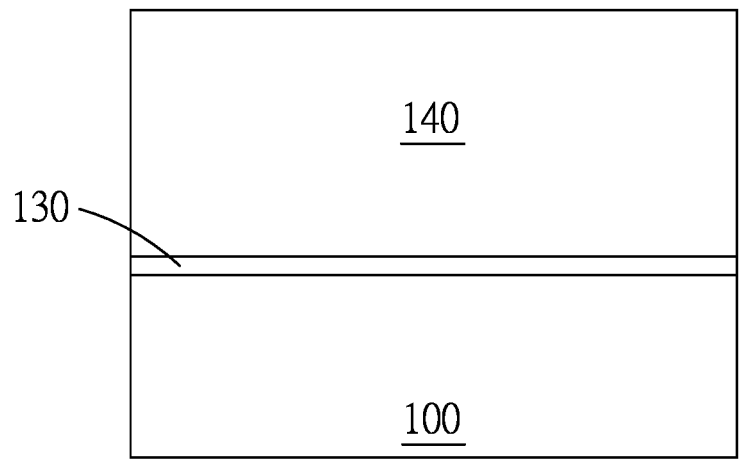

Referring to FIGS. 4 and 7, the method 400A proceeds to step 402, where a gate material layer 140 is formed on the ferroelectric material layer 130. The gate material layer 140 may include a metallic material, a metal compound, polycrystalline silicon, or doped silicon. Other suitable gate materials are within the contemplated scope of the present disclosure. The metallic material may include, for example, but not limited to, silver, aluminum, copper, tungsten, nickel, other suitable materials, alloys thereof, or combinations thereof. The metal compound may include, for example, but not limited to, titanium nitride, tantalum nitride, metal silicide, other suitable materials, or combinations thereof. The gate material layer 140 may be deposited by, for example, but not limited to, PVD, CVD, sputtering, plating, combinations thereof, or other suitable techniques.

Figure 8:
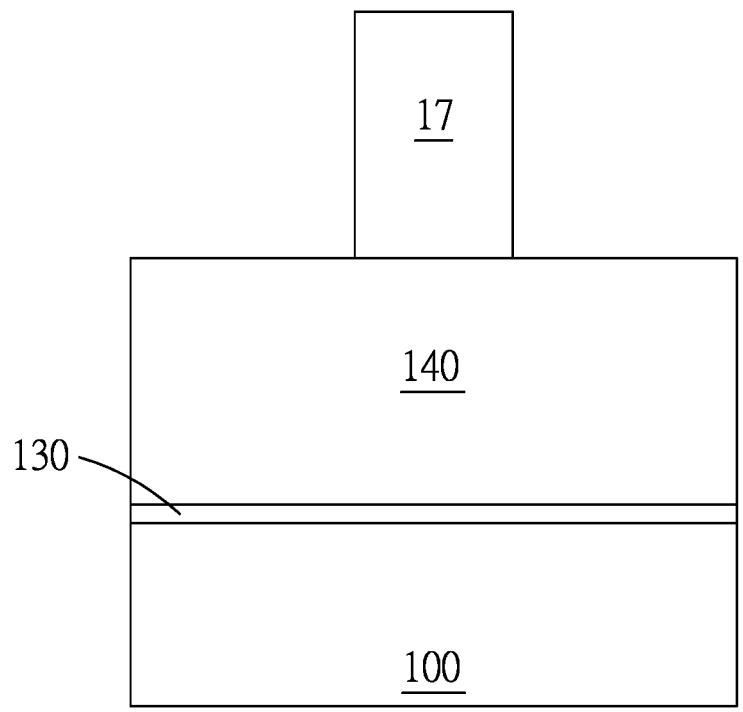

Referring to FIGS. 4 and 8, the method 400A proceeds to step 403, where a patterned mask 17 is formed on the gate material layer 140. In some embodiments, the patterned mask 17 may be replaced with a patterned photoresist.

Figure 9:
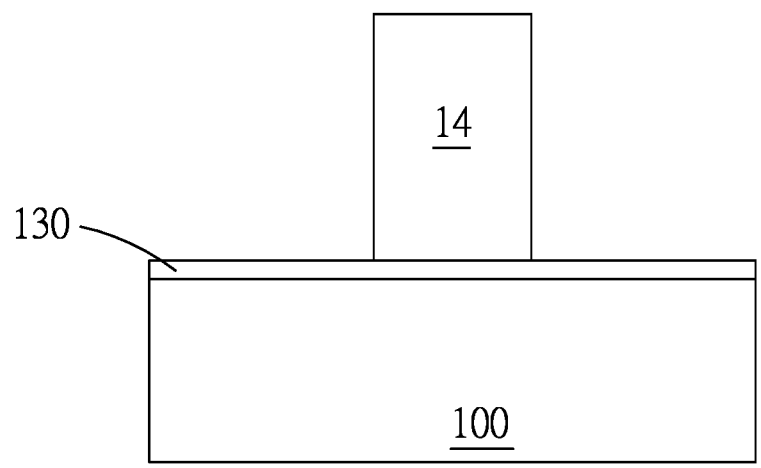

Referring to FIGS. 4 and 9, the method 400A proceeds to step 404, where a gate electrode 14 is formed by etching the gate material layer 140 exposed from the patterned mask 17 (see FIG. 8). Step 404 may be implemented using a known process in the art, such as, but not limited to, a dry etching process, a wet etching process, other suitable processes, or combinations thereof. In some embodiments, the patterned mask 17 may be removed after step 404. In alternative embodiments, the patterned mask 17 may be removed after the following step 405. In yet alternative embodiments, the patterned mask 17 may be kept on the gate electrode 14.

Figure 10:
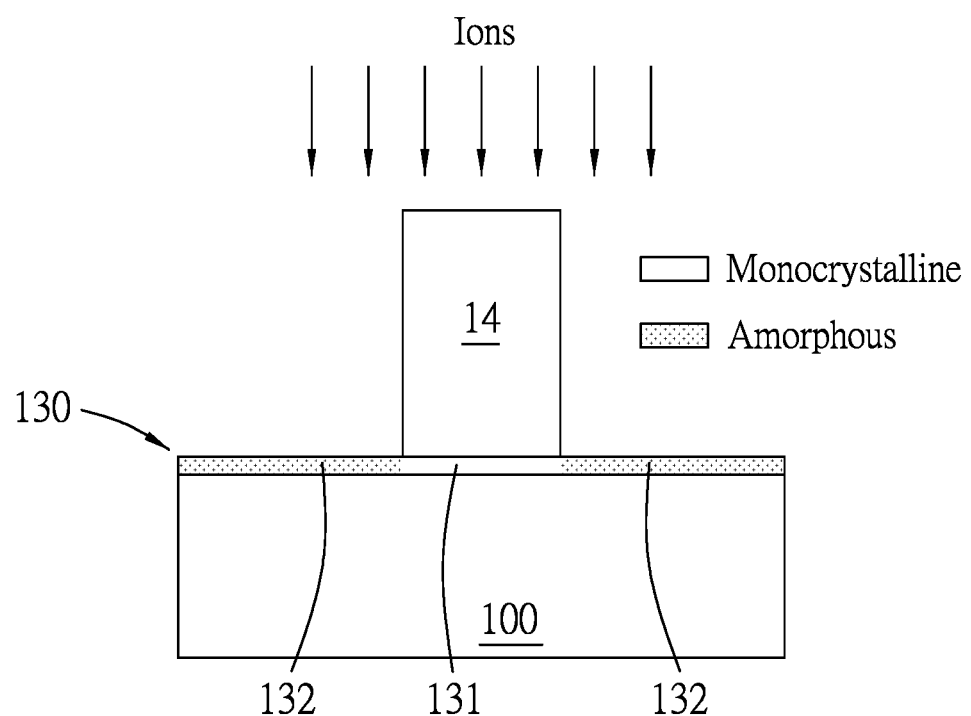

Referring to FIGS. 4 and 10, the method 400A proceeds to step 405, where the ferroelectric material layer 130 exposed from the gate electrode 14 is amorphized to form two amorphous regions 132 at two opposite sides of the gate electrode 14. In some embodiments, the amorphous regions 132 are formed by ion implantation, i.e., introducing ions of an electrically inactive species into two exposed portions of the ferroelectric material layer 130. The ions of an electrically inactive species may include, for example, but not limited to, silicon ions, germanium ions, indium ions, xenon ions, argon ions, combinations thereof, or other suitable ions of electrically inactive species. Therefore, after step 405, the ferroelectric material layer 130 has the two amorphous regions 132 and a monocrystalline region 131 beneath the gate electrode 14.

Figure 11:
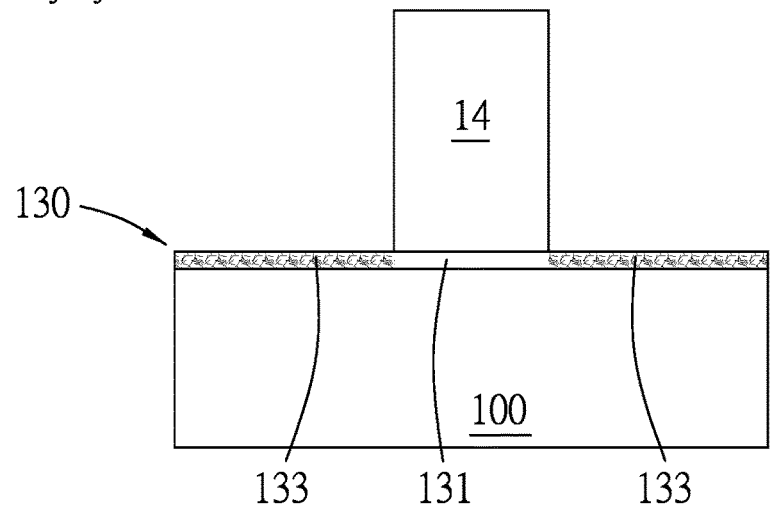

Referring to FIGS. 4 and 11, the method 400A proceeds to step 406, where an annealing process is conducted to recrystallize the ferroelectric material layer 130, to thereby permit the two amorphous regions 132 shown in FIG. 10 to be respectively formed into two polycrystalline regions 133.

Figure 12:
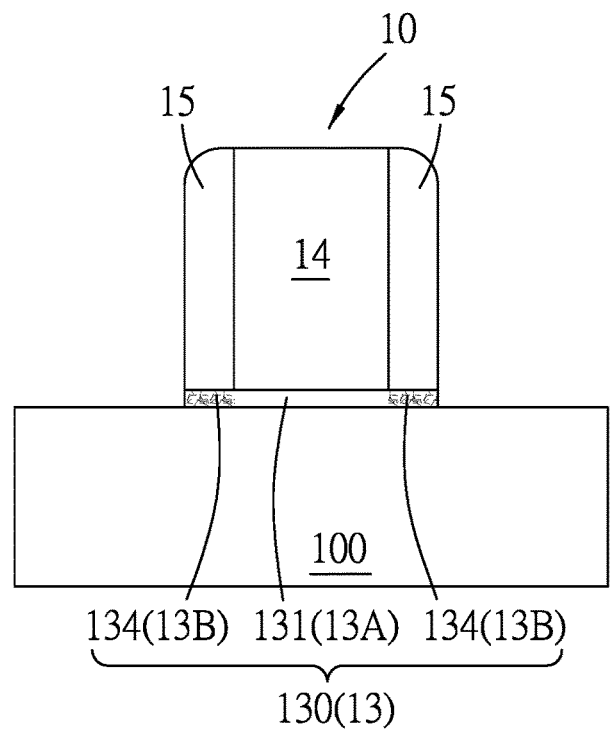

Referring to FIGS. 4 and 12, the method 400A proceeds to step 407, where two spacers 15 are respectively formed at two opposite sides of the gate electrode 14. The spacers 15 may be formed by depositing a dielectric layer (not shown) over the gate electrode 14 and the ferroelectric material layer 130 exposed from the gate electrode 14, and etching the dielectric layer to form the spacers 15. The polycrystalline regions 133 (shown in FIG. 11) exposed from the spacers 15 may be etched after formation of the spacers 15 to form two polycrystalline areas 134. The spacers 15 may include, for example, but not limited to, silicon oxide, silicon nitride, silicon oxynitride, high dielectric constant (k) materials, or combinations thereof. Other suitable materials are within the contemplated scope of the present disclosure. The etching of the not-shown dielectric layer may be implemented using a known process in the art, such as, but not limited to, a dry etching process, a wet etching process, other suitable processes, or combinations thereof. After step 407, the ferroelectric material layer 130 shown in FIG. 12 is also referred to as the ferroelectric layer 13 (also shown in FIGS. 2 and 2A) which includes the monocrystalline region 13A (the monocrystalline region 131 of the ferroelectric material layer 130) and the polycrystalline regions 13B (the polycrystalline areas 134 of the ferroelectric material layer 130). Although each of the spacers 15 shown in FIG. 12 has a rounded corner, it may have an angled corner based on the selected etching process. After step 407, the ferroelectric layer 13, the gate electrode 14, and the spacers 15 together constitute a gate structure 10.

Figure 13:
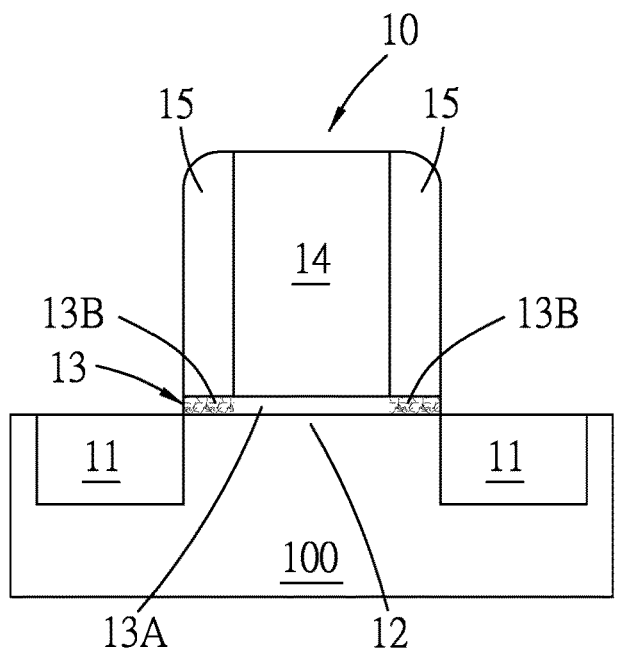

Referring to FIGS. 4 and 13, the method 400A proceeds to step 408, where two source/drain regions 11 are formed in the substrate 100 at two opposite sides of the gate structure 10. In some embodiments, step 408 may be implemented by introducing p-type or n-type impurities in the substrate 100 at the two opposite sides of the gate structure 10 so as to form the source/drain regions 11. In alternative embodiments, step 408 may be implemented by forming two cavities (not shown) in the substrate 100 at the two opposite sides of the gate structure 10, and by epitaxially growing the source/drain regions 11 (having a p-type or n-type conductivity) respectively in the cavities. After step 408, (i) a channel region 12 (which may correspond to the channel layer shown in FIG. 2) is formed between the source/drain regions 11, (ii) the monocrystalline region 13A of the ferroelectric layer 13 is located between the channel region 12 and the gate electrode 14 to serve as a gate dielectric and to achieve sharp polarization switching of a semiconductor device, and (iii) each of the polycrystalline regions 13B is located between the channel region 12 and a respective one of the spacers 15 to enhance the nucleation of the switching of a semiconductor device.

Figure 14:
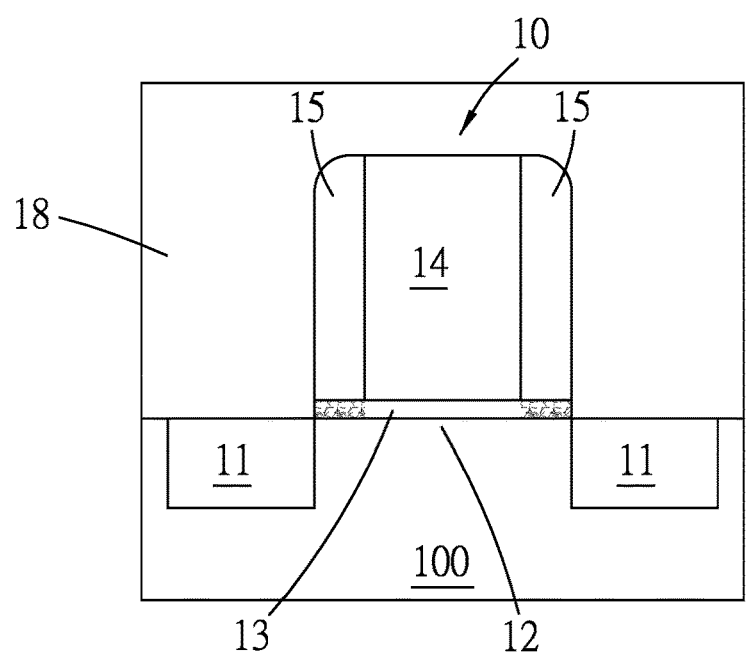

Referring to FIGS. 4 and 14, the method 400A proceeds to step 409, where an interlayer dielectric (ILD) layer 18 is formed over the gate structure 10 and the substrate 100. Step 409 may be implemented by depositing a dielectric material layer (not shown) using, for example, but not limited to, CVD, PVD, sputtering, combinations thereof, or other suitable techniques, followed by a chemical mechanical polishing (CMP) process or other suitable techniques to planarize the not-shown dielectric material layer. In some embodiments, the ILD layer 18 may be a single material layer. In alternative embodiments, the ILD layer 18 may be constituted by multiple films with different materials. In some embodiments, the ILD layer 18 may include, but not limited to, polyimide, epoxy resin, acrylic resin, phenol resin, benzocyclobutene (BCB), polybenzooxazole (PBO), other suitable polymer-based dielectric materials, or combinations thereof. In alternative embodiments, the ILD layer 18 may include silicon oxide, silicon oxynitride, or combinations thereof. Other suitable dielectric materials are within the contemplated scope of the present disclosure. In some embodiments, the ILD layer 18 may correspond to the dielectric layer 32 of the contact-level structure L0.

Figure 15:
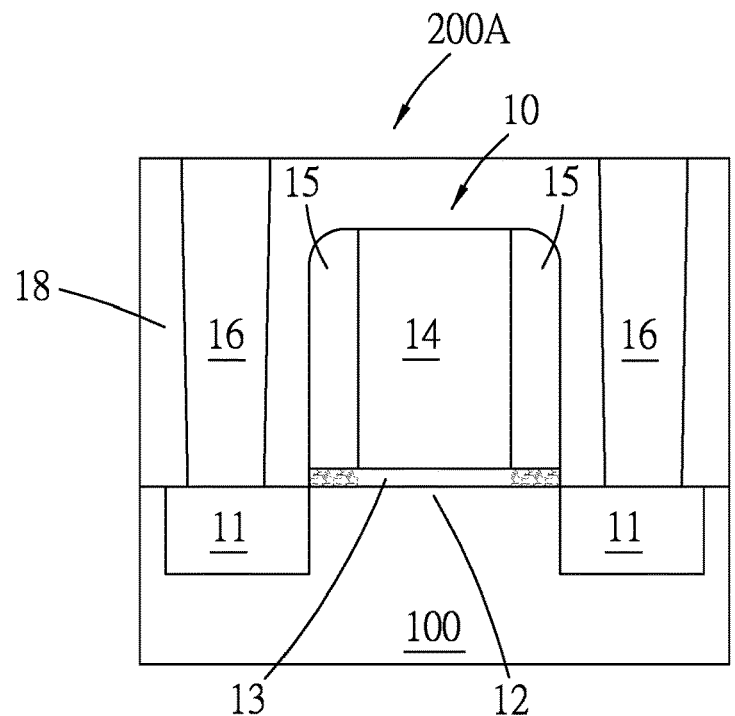

Referring to FIGS. 4 and 15, the method 400A proceeds to step 410, where two source/drain contacts 16 are formed in the ILD layer 18 to be in electrical contact with the source/drain regions 11 of the substrate 100. Step 410 may be implemented using, for example, but not limited to, a single damascene process. The single damascene process may include (i) forming two recesses (not shown) in the ILD layer 18 to expose the source/drain regions 11, (ii) depositing a contact material layer (not shown) over the ILD layer 18 to fill in the recesses, and (iii) conducting a CMP process or other suitable techniques to remove the excess contact material layer on the ILD layer 18. The source/drain contacts 16 may include, for example, but not limited to, cobalt, tungsten, copper, titanium, tantalum, aluminum, zirconium, hafnium, combinations thereof, or alloys thereof. Other suitable materials are within the contemplated scope of the present disclosure. The deposition of the not-shown contact material layer may be implemented using CVD, ALD, plating, or other suitable deposition techniques. After step 410, a semiconductor device 200A corresponding to the transistor 301 shown in FIG. 3 may be obtained.

In alternative embodiments, other suitable methods may also be applied for forming the semiconductor device 200A shown in FIG. 15. In yet alternative embodiments, additional features may be added in the semiconductor device 200A, and some features in the semiconductor device 200A may be modified, replaced, or eliminated without departure of the spirit and scope of the present disclosure.

Figure 16:
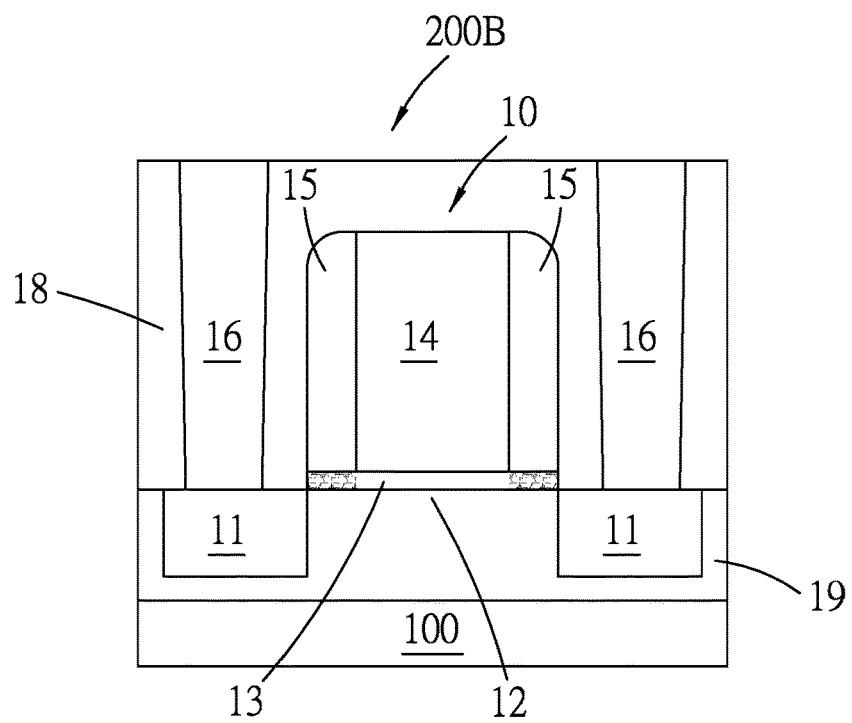
FIG. 16 is a schematic cross-sectional view illustrating a semiconductor device in accordance with some embodiments.

FIG. 16 illustrates a schematic cross-sectional view of a semiconductor device 200B in accordance with some embodiments. The semiconductor device 200B is similar to the semiconductor device 200A shown in FIG. 15 except that the semiconductor device 200B is formed on a semiconductor fin 19 on the substrate 100. The semiconductor fin 19 may include, for example, but not limited to, silicon, silicon germanium, silicon boride, or combinations thereof. Other suitable materials are within the contemplated scope of the present disclosure. The semiconductor device 200B may be formed using a method 400B similar to the method 400A, except for steps 401 and 408. Referring to FIG. 4, in step 401 of the method 400B, the ferroelectric material layer 130 shown in FIG. 6 is formed on the semiconductor fin 19 shown in FIG. 16, and in step 408 of the method 400B, the source/drain regions 11 are formed in the semiconductor fin 19 shown in FIG. 16 and the channel region 12 is located between the source/drain regions 11. In alternative embodiments, other suitable methods may also be applied for forming the semiconductor device 200B shown in FIG. 16. In yet alternative embodiments, additional features may be added in the semiconductor device 200B, and some features in the semiconductor device 200B may be modified, replaced, or eliminated without departure of the spirit and scope of the present disclosure.

Figure 17:
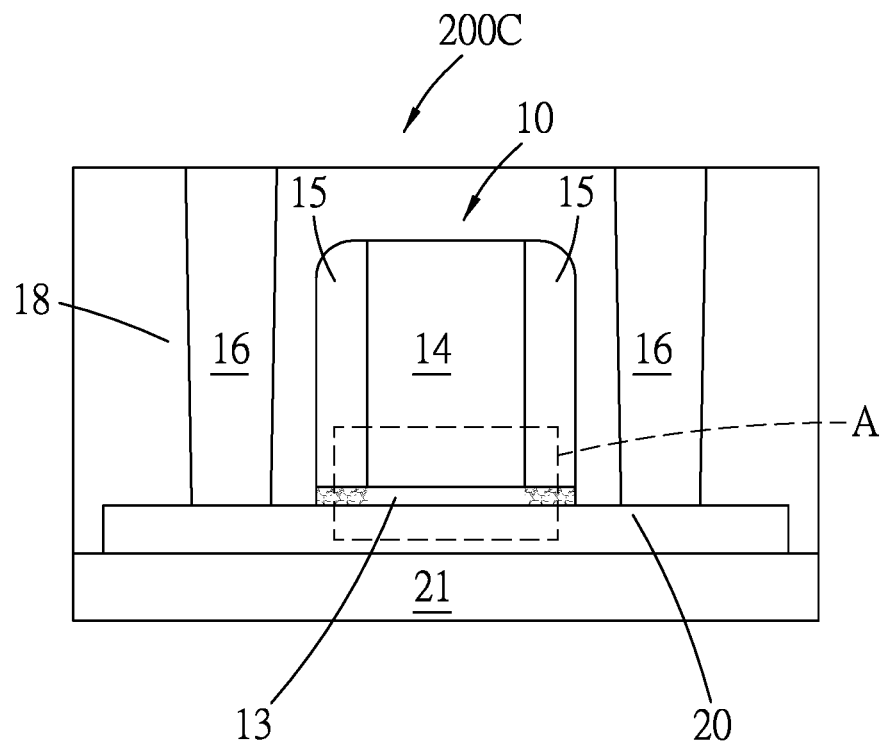
FIG. 17 is a schematic cross-sectional view illustrating a semiconductor device in accordance with some embodiments.
Figure 17A:
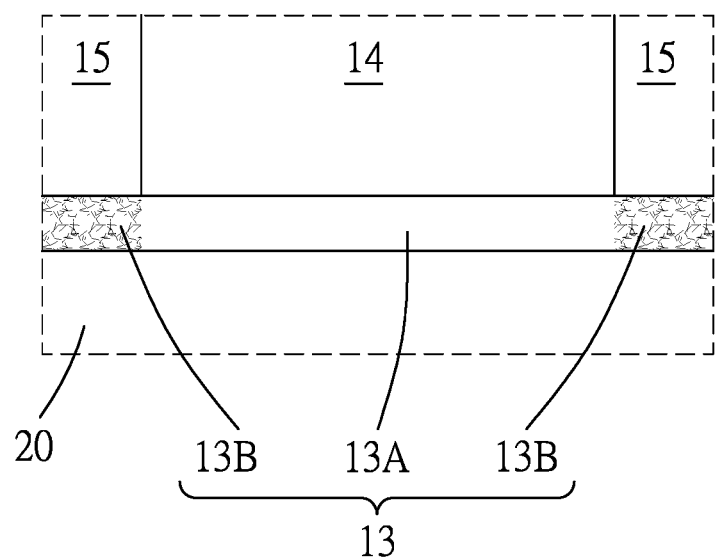
FIG. 17A is a partially enlarged view of FIG. 17.

FIG. 17 is a schematic cross-sectional view illustrating a semiconductor device 200C in accordance with some embodiments. FIG. 17A is an enlarged view of an area A in FIG. 17. The semiconductor device 200C is similar to the semiconductor device 200A except that the semiconductor device 200C may be located in the BEOL, and may be exemplified as the transistor 302 shown in FIG. 3. In addition, the semiconductor device 200C may include a thin film channel 20 and a dielectric layer 21 in replacement of the substrate 100 of the semiconductor device 200A. The ferroelectric layer 13 is formed on the thin film channel 20, the monocrystalline region 13A is located between the gate electrode 14 and the thin film channel 20, and each of the polycrystalline regions 13B is located between the thin film channel 20 and a respective one of the spacers 15. The thin film channel 20 may correspond to the channel layer 20 shown in FIGS. 2 and 3, and the dielectric layer 21 may correspond to the dielectric layer 32 of the interconnect-level structure Ln−1 shown in FIG. 3. The thin film channel 20 may include, for example, but not limited to, amorphous silicon and/or a semiconducting oxide, such as indium gallium zinc oxide (InGaZnO, IGZO), tungsten-doped indium oxide (InWO), indium zinc oxide (InZnO), indium tin oxide (InSnO), gallium oxide (GaO$_x$), indium oxide (InO$_x$) and the like. Other suitable channel materials are within the contemplated scope of the present disclosure. The dielectric layer 21 may include, for example, but not limited to, polyimide, epoxy resin, acrylic resin, phenol resin, BCB, PBO, silicon oxide, silicon nitride, silicon oxynitride, high dielectric constant (k) materials, or combinations thereof. Other suitable dielectric materials are within the contemplated scope of the present disclosure. In some embodiments, the source/drain contacts 16 of the semiconductor device 200C may serve as a source and a drain of the semiconductor device 200C, respectively, although they are not so limited. In alternative embodiments, two source/drain patterns (not shown) may be formed between the thin film channel 20 and the source/drain contacts 16 to respectively serve a source and a drain of the semiconductor device 200C.

In addition, referring to FIGS. 4 and 17, the semiconductor device 200C may be manufactured using a method 400B similar to the method 400A except that in the method 400B, (i) before step 401, the dielectric layer 21 and the thin film channel 20 are sequentially formed, (ii) in step 401, the ferroelectric material layer 130 shown in FIG. 6 is formed on the thin film channel 20, and (iii) step 408 may be skipped. The dielectric layer 21 may be formed on the dielectric layer 32 of the interconnect-level structure Ln−1 shown in FIG. 3 using CVD, PVD, sputtering, combinations thereof, or other suitable techniques. The thin film channel 20 may be formed on the dielectric layer 21 using CVD, PVD, ALD, plasma-enhanced CVD (PECVD), epitaxial growth, or other suitable techniques.

In alternative embodiments, other suitable methods may also be applied for forming the semiconductor device 200C shown in FIG. 17. In yet alternative embodiments, additional features may be added in the semiconductor device 200C, and some features in the semiconductor device 200C may be modified, replaced, or eliminated without departure of the spirit and scope of the present disclosure.

Figure 18:
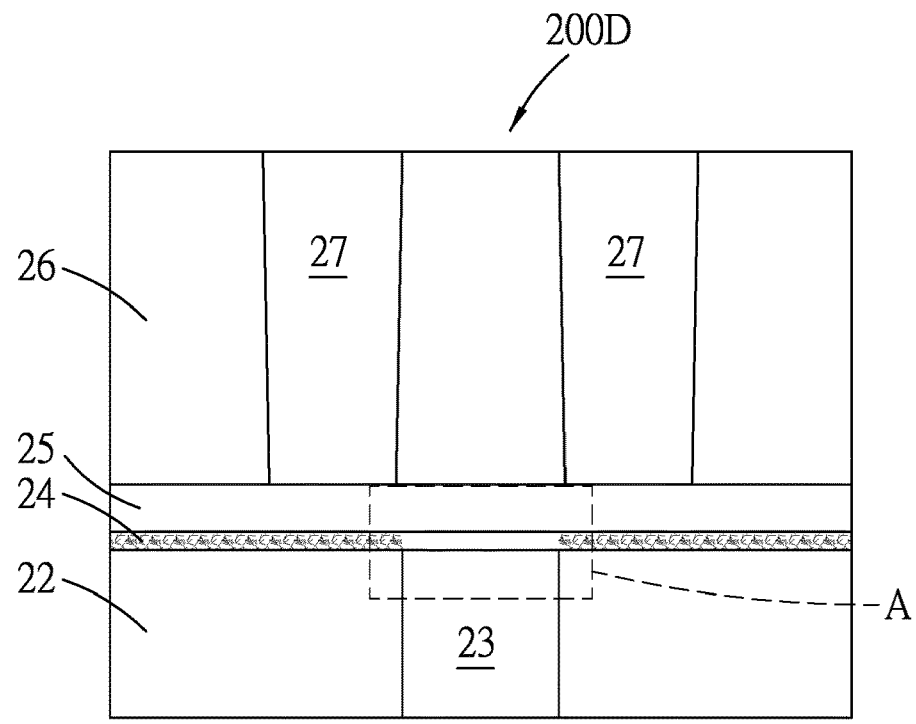
FIG. 18 is a schematic cross-sectional view illustrating a semiconductor device in accordance with some embodiments.
Figure 18A:
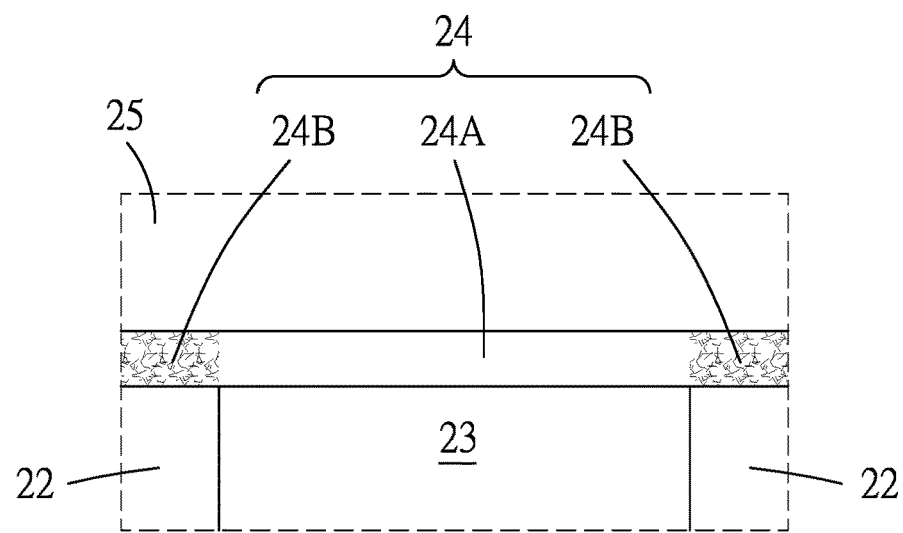
FIG. 18A is a partially enlarged view of FIG. 18.
Figure 18B:
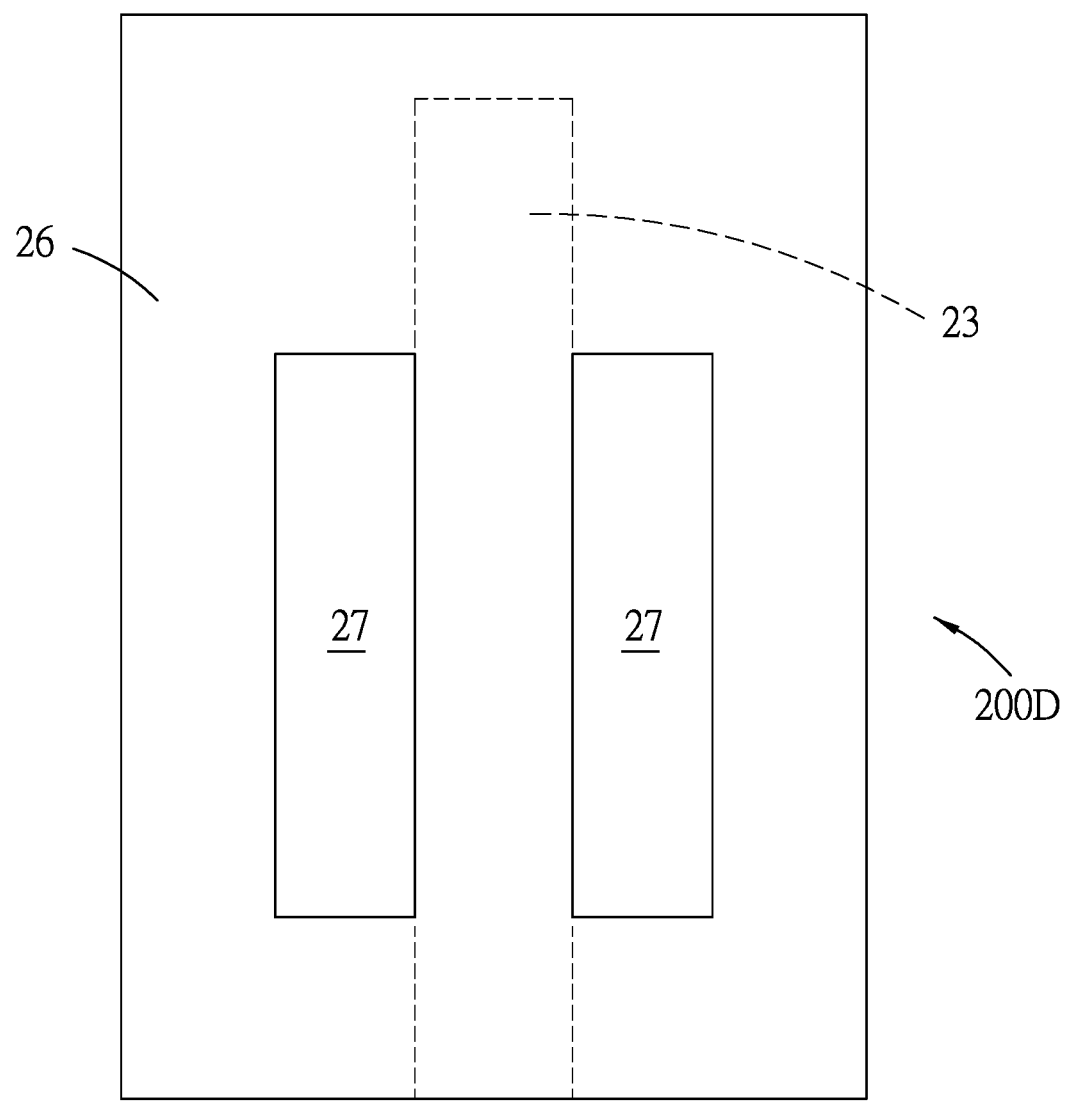
FIG. 18B is a top view of FIG. 18.

FIG. 18 is a schematic cross-sectional view of a semiconductor device 200D in accordance with some embodiments. FIG. 18A is an enlarged view of an area A in FIG. 18. FIG. 18B is a top view of FIG. 18. The semiconductor device 200D is similar to the semiconductor device 200C except for the location of a gate electrode. The semiconductor device 200D may be located in the BEOL, and may be formed in the interconnect-level structure Ln shown in FIG. 3. The semiconductor device 200D may include a first dielectric layer 22, a back gate electrode 23 formed in the first dielectric layer 22, a ferroelectric layer 24 formed over the back gate electrode 23 and the first dielectric layer 22, a thin film channel 25 formed on the ferroelectric layer 24, a second dielectric layer 26 formed over the thin film channel 25, and two source/drain contacts 27 formed in the second dielectric layer 26 to be respectively in electrical contact with two regions of the thin film channel 25 at two opposite sides of the back gate electrode 23. The first dielectric layer 22 and the second dielectric layer 26 may correspond to the dielectric layer 32 of the interconnect-level structure Ln shown in FIG. 3, and may include a material similar to that of the dielectric layer 21 of the semiconductor device 200C. The materials of the back gate electrode 23, the ferroelectric layer 24, the thin film channel 25, and the source/drain contacts 27 may be similar to those of the gate electrode 14, the ferroelectric layer 13, the thin film channel 20, and the source/drain contacts 16 of the semiconductor device 200C, respectively. Other suitable materials are within the contemplated scope of the present disclosure. In some embodiments, the source/drain contacts 27 may be disposed to bring the thin film channel 25 into contact with the contact vias 34 and/or the metal lines 33 in the interconnect-level structure Ln+1 shown in FIG. 3. Similar to the ferroelectric layer 13 of the semiconductor device 200C, the ferroelectric layer 24 includes a monocrystalline region 24A which is located between the back gate electrode 23 and thin film channel 25, and two polycrystalline regions 24B each of which is located between the first dielectric layer 22 and the thin film channel 25. Similar to the source/drain contacts 16 of the semiconductor device 200C, in some embodiments, the source/drain contacts 27 of the semiconductor device 200D may serve as a source and a drain of the semiconductor device 200D, and in alternative embodiments, two source/drain patterns (not shown) may be formed between the thin film channel 25 and the source/drain contacts 27 to respectively serve a source and a drain of the semiconductor device 200D.

Figure 19:
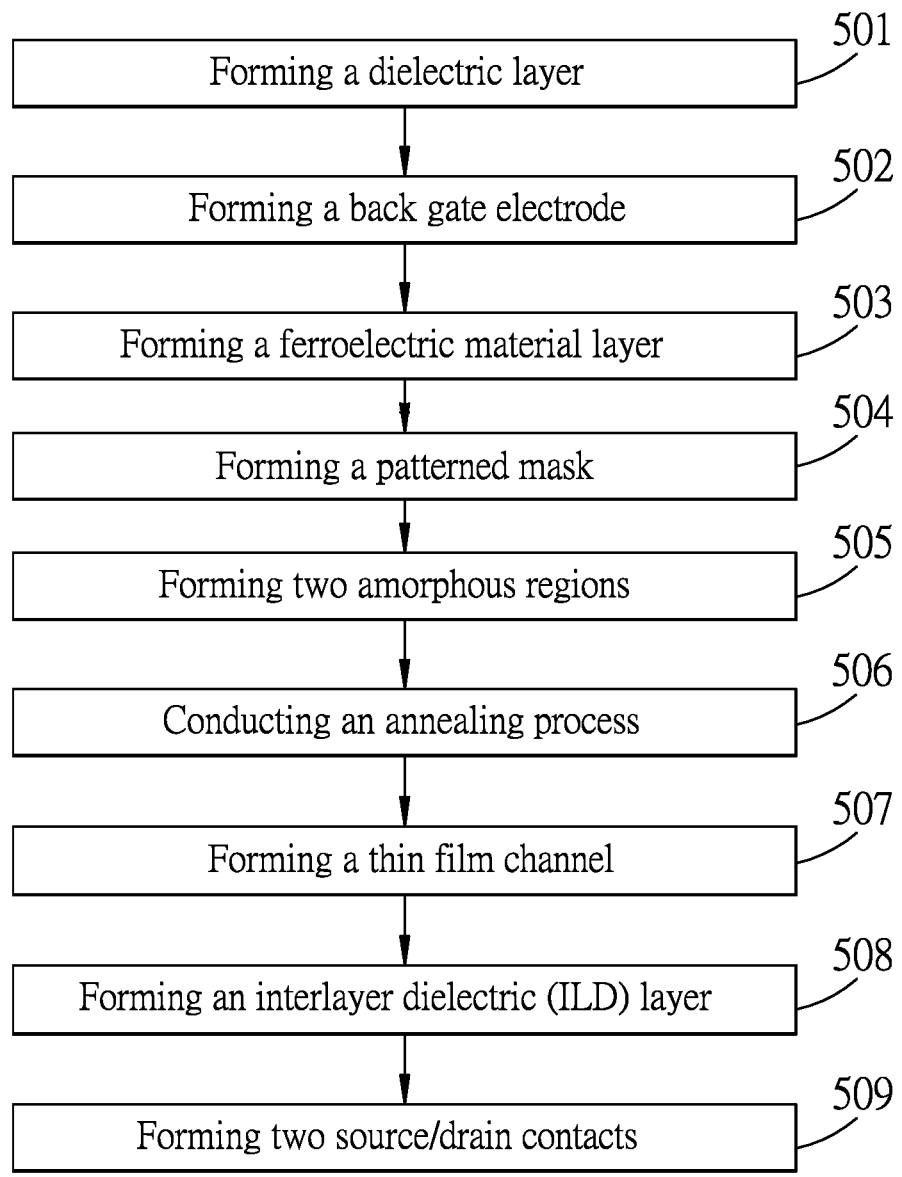
FIG. 19 is a flow diagram illustrating a method for manufacturing a semiconductor device in accordance with some embodiments.

FIG. 19 is a flow diagram illustrating a method 500A for manufacturing a semiconductor device located in the BEOL (for example, the semiconductor device 200D shown in FIGS. 18, 18A, and 18B) in accordance with some embodiments. FIGS. 20 to 28 illustrate schematic views of the intermediate stages of the method 500A.

Figure 20:
FIGS. 20 to 28 are schematic views illustrating intermediate stages of a method for manufacturing a semiconductor device in accordance with some embodiments as depicted in FIG. 19.

Referring to FIGS. 19 and 20, the method 500A begins at step 501, where a dielectric layer 22 is formed. The dielectric layer 22 may include a material similar to that of the first dielectric layer 22 of the semiconductor device 200D, and step 501 may be implemented using CVD, PVD, sputtering, combinations thereof, or other suitable techniques. In some embodiments, in step 501, the dielectric layer 22 may be formed on the interconnect-level structure Ln−1 shown in FIG. 3.

Figure 21:
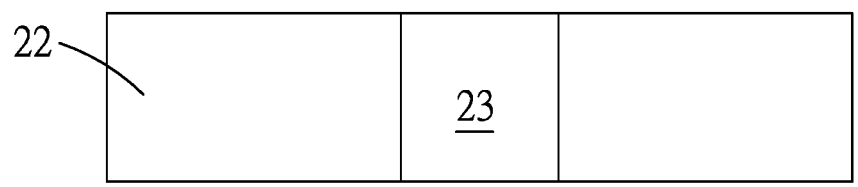

Referring to FIGS. 19 and 21, the method 500A proceeds to step 502, where a back gate electrode 23 is formed in the dielectric layer 22. Step 502 may be implemented using, for example, but not limited to, a damascene gate formation process or other suitable processes. The damascene gate formation process may include (i) forming a trench (not shown) in the dielectric layer 22, (ii) depositing a gate material layer (not shown) over the dielectric layer 22 to fill the trench, and (iii) conducting a CMP process or other suitable techniques to remove the excess gate material layer on the dielectric layer 22. The trench may be formed using known photolithography and etching processes. The material and the deposition process for the not-shown gate material layer are similar to those for the gate material layer 140 described in step 402 of the method 400A.

Figure 22:
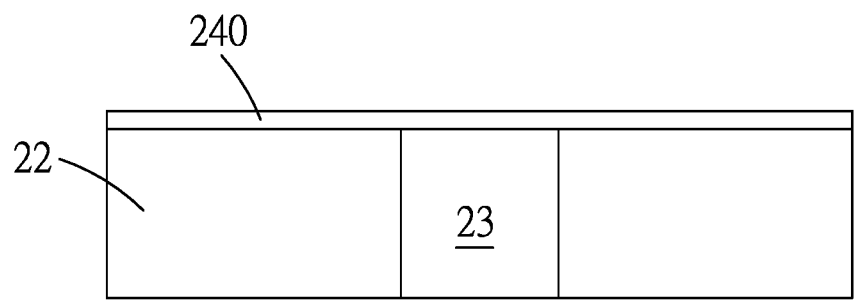

Referring to FIGS. 19 and 22, the method 500A proceeds to step 503, where a ferroelectric material layer 240 is formed over the back gate electrode 23 and the dielectric layer 22. The materials and the process for forming the ferroelectric material layer 240 are similar to those for the ferroelectric material layer 130 described in step 401 of the method 400A.

Figure 23:
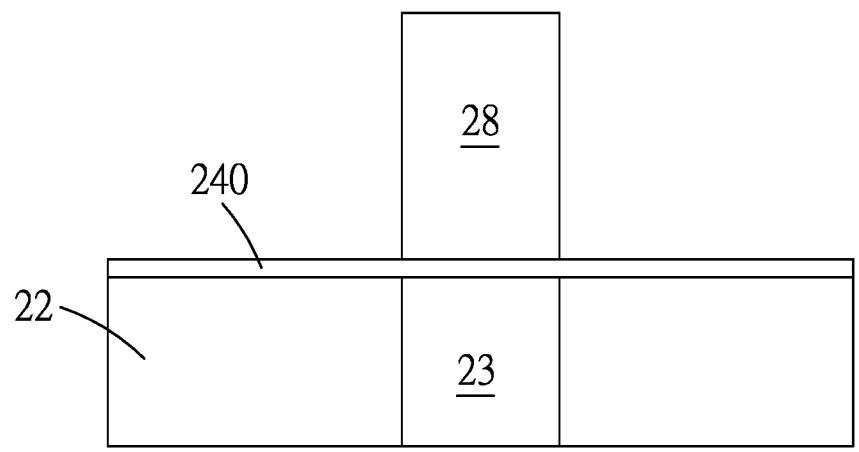

Referring to FIGS. 19 and 23, the method 500A proceeds to step 504, where a patterned mask 28 is formed over the ferroelectric material layer 240 to cover a portion of the ferroelectric material layer 240 in a position above the back gate electrode 23. In some embodiments, the patterned mask 28 may be replaced with a patterned photoresist.

Figure 24:
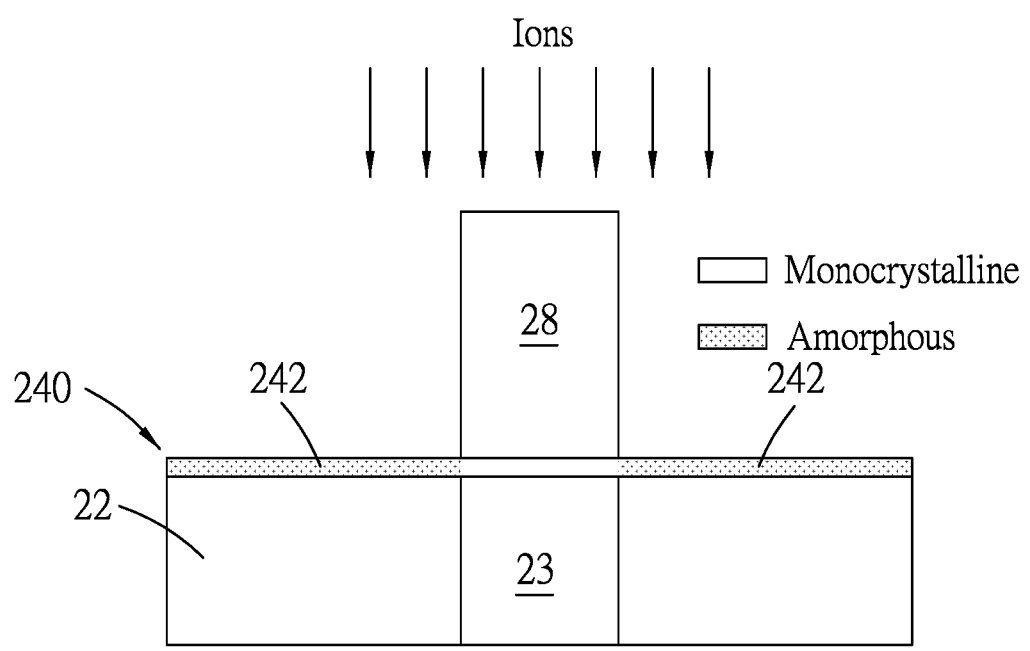

Referring to FIGS. 19 and 24, the method 500A proceeds to step 505, where the ferroelectric material layer 240 exposed from the patterned mask 28 is amorphized to form two amorphous regions 242 at two opposite sides of the patterned mask 28. The amorphous regions 242 may be formed by ion implantation similar to that described in step 405 of the method 400A. The patterned mask 28 may be removed after step 505.

Figure 25:
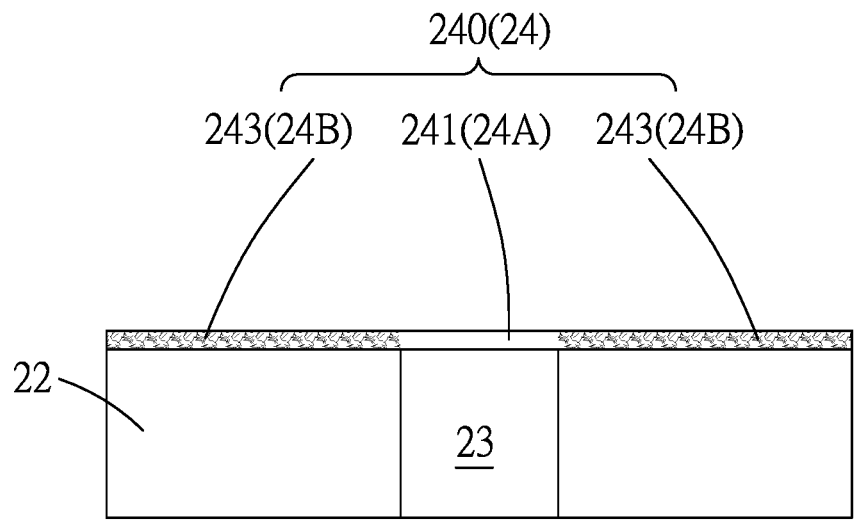

Referring to FIGS. 19 and 25, the method 500A proceeds to step 506, where an annealing process is conducted to recrystallize the ferroelectric material layer 240, to thereby permit the two amorphous regions 242 shown in FIG. 24 to be respectively formed into two polycrystalline regions 243. After step 506, a monocrystalline region 241 is located between the two polycrystalline regions 243, and the ferroelectric material layer 240 is also referred to as the ferroelectric layer 24 (also shown in FIGS. 18 and 18A) which includes the monocrystalline region 24A (the monocrystalline region 241 of the ferroelectric material layer 240) and the two polycrystalline regions 24B (the polycrystalline regions 243 of the ferroelectric material layer 240).

In alternative embodiments, steps 504 to 506 may be skipped, and based on the selection of the materials for the back gate electrode 23 and the dielectric layer 22, the ferroelectric material layer 240 grown on the back gate electrode 23 may be monocrystalline, and the ferroelectric material layer 240 grown on the dielectric layer 22 may be polycrystalline. Therefore, in step 503, the ferroelectric material layer 240 (the ferroelectric layer 24) may be formed to have the monocrystalline region 241 (24A) and the two polycrystalline regions 243 (24B) shown in FIG. 25.

Figure 26:
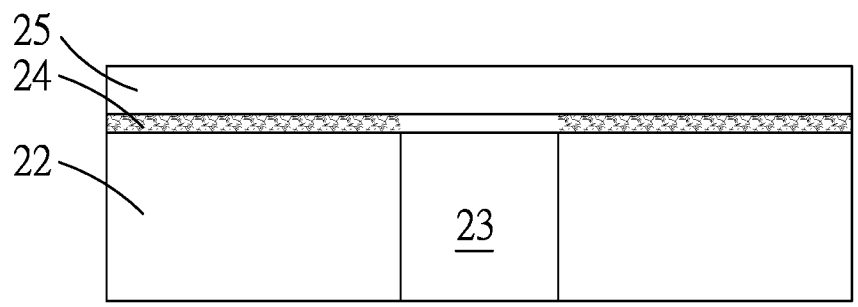

Referring to FIGS. 19 and 26, the method 500A proceeds to step 507, where a thin film channel 25 is formed over the ferroelectric layer 24. The materials and the formation for the thin film channel 25 are similar to those for the thin film channel 20 of the semiconductor device 200C.

Figure 27:
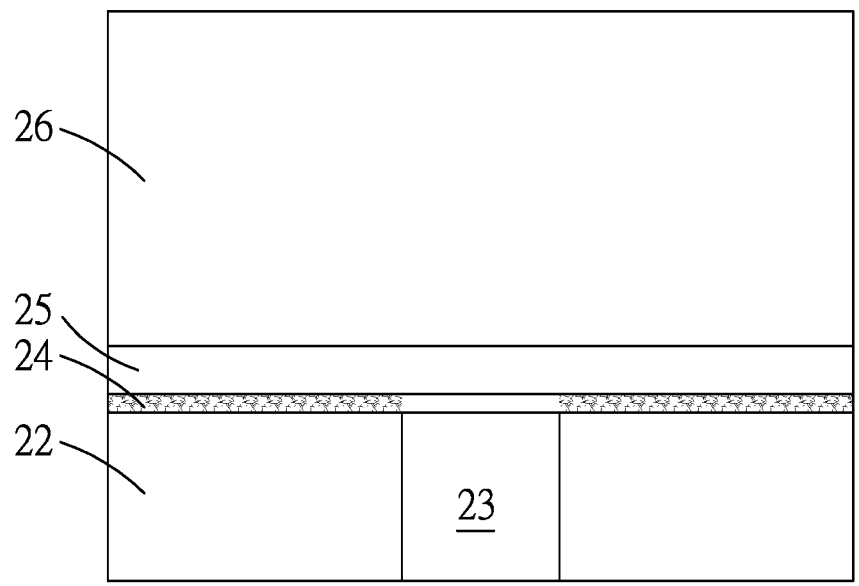

Referring to FIGS. 19 and 27, the method 500A proceeds to step 508, where an interlayer dielectric (ILD) layer 26 is formed over the thin film channel 25. In some embodiments, the materials and the formation for the ILD layer 26 may be similar to those for the dielectric layer 22 described in step 501. The dielectric layer 22 and the ILD layer 26 may correspond to the first dielectric layer 22 and the second dielectric layer 26 of the semiconductor device 200D, respectively.

Figure 28:
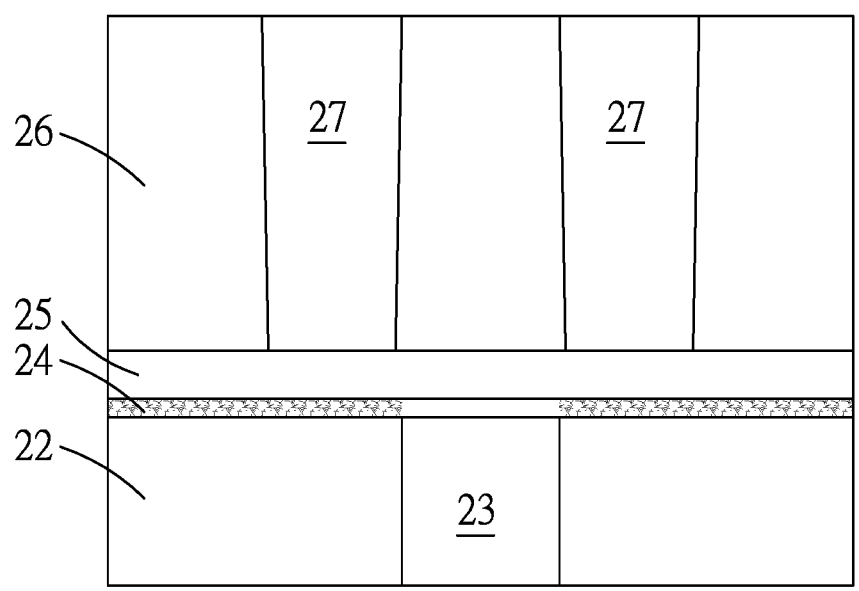

Referring to FIGS. 19 and 28, the method 500A proceeds to step 509, where two source/drain contacts 27 are formed in the ILD layer 26 using, for example, but not limited to, a single damascene process which may be similar to that described in step 410 of the method 400A, or other suitable processes. After step 509, a semiconductor device corresponding to the semiconductor device 200D shown in FIGS. 18, 18A, and 18B may be obtained.

In alternative embodiments, other suitable methods may also be applied for forming the semiconductor device 200D shown in FIG. 18. In yet alternative embodiments, additional features may be added in the semiconductor device 200D, and some features in the semiconductor device 200D may be modified, replaced, or eliminated without departure of the spirit and scope of the present disclosure.

Figure 29:
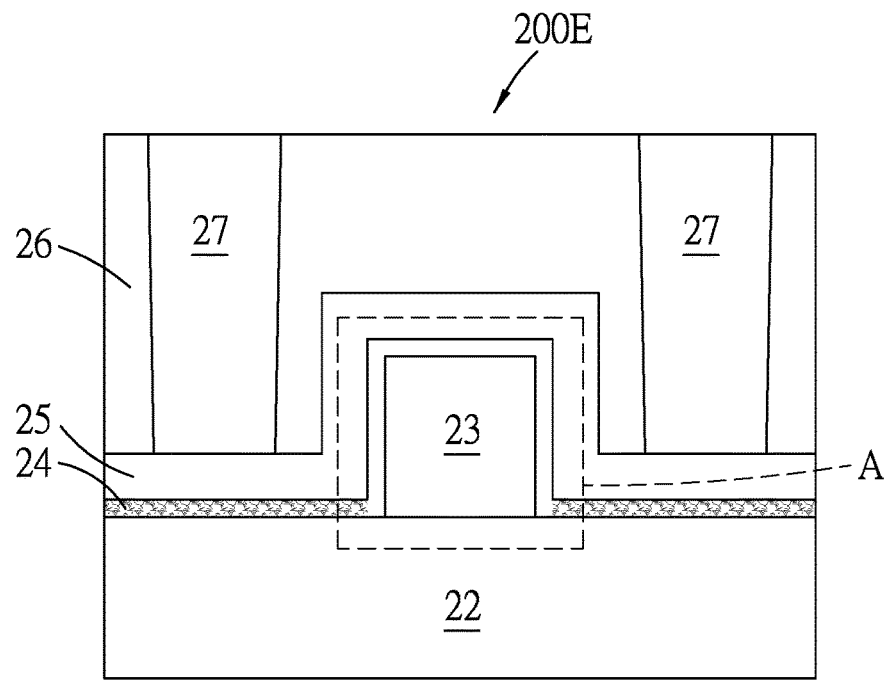
FIG. 29 is a schematic cross-sectional view illustrating a semiconductor device in accordance with some embodiments.
Figure 29A:
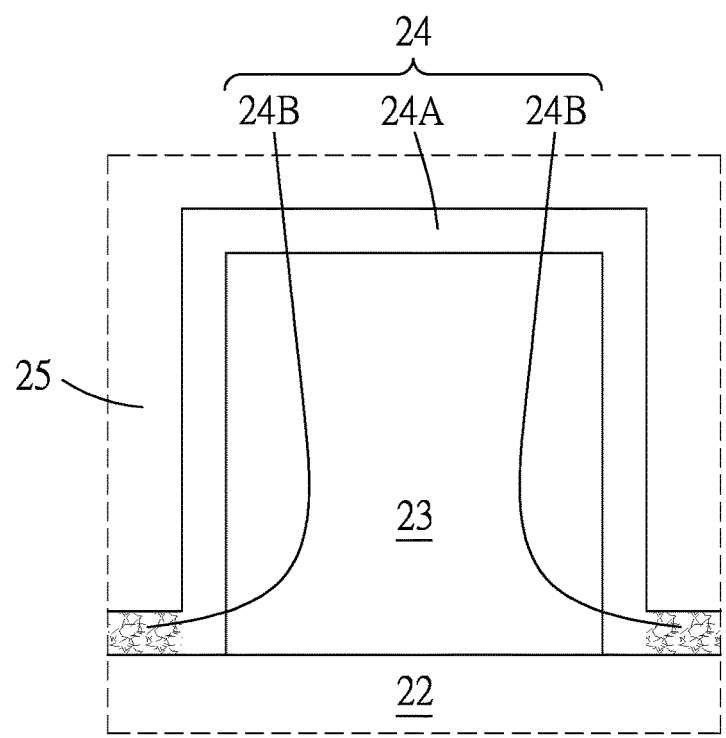
FIG. 29A is a partially enlarged view of FIG. 29.

FIG. 29 is a schematic cross-sectional view of a semiconductor device 200E in accordance with some embodiments. FIG. 29A is an enlarged view of an area A in FIG. 29. The semiconductor device 200E is similar to the semiconductor device 200D except that the back gate electrode 23 of the semiconductor device 200E is formed on the dielectric layer 22. The semiconductor device 200E may be manufactured using a method 500B similar to the method 500A except that in step 502 of the method 500B, the back gate electrode 23 is formed by (i) depositing a gate material layer (not shown) over the dielectric layer 22, and (ii) patterning the gate material layer using known photolithography and etching processes. The photolithography process may include, for example, but not limited to, coating a photoresist, soft-baking, exposing the photoresist through a photomask, post-exposure baking, and developing the photoresist, followed by hard-baking so as to form a patterned photoresist. The etching process may be implemented by etching the gate material layer through the patterned photoresist using, for example, but not limited to, a dry etching process, a wet etching process, other suitable processes, or combinations thereof. In alternative embodiments, other suitable methods may also be applied for forming the semiconductor device 200E shown in FIG. 29. In yet alternative embodiments, additional features may be added in the semiconductor device 200E, and some features in the semiconductor device 200E may be modified, replaced, or eliminated without departure of the spirit and scope of the present disclosure.

In this disclosure, a single crystal ferroelectric gate dielectric (i.e., the monocrystalline region of the ferroelectric layer) is located between the channel layer and the gate electrode, and thus the semiconductor device may provide sharp polarization switching. As such, the semiconductor device of the present disclosure may achieve acceptable remnant polarization by applying a relatively low electric field. In addition, because a polycrystalline ferroelectric material (i.e., the polycrystalline regions of the ferroelectric layer) is located at the edge of the gate electrode to enhance the nucleation of the switching, the semiconductor device may have a fast switching speed.

In accordance with some embodiments of the present disclosure, a semiconductor device includes a gate electrode, a channel layer, and a ferroelectric layer. The ferroelectric layer includes a monocrystalline region located between the gate electrode and the channel layer to serve as a gate dielectric.

In accordance with some embodiments of the present disclosure, a method for manufacturing a semiconductor device includes steps of: forming a ferroelectric material layer on a channel layer; forming a gate electrode on the ferroelectric material layer; and treating the ferroelectric material layer so as to form the ferroelectric material layer into a ferroelectric layer which includes a monocrystalline region between the gate electrode and the channel layer, and a polycrystalline region at an edge of the gate electrode.

In accordance with some embodiments of the present disclosure, a method for manufacturing a semiconductor device includes steps of: forming a dielectric layer; forming a back gate electrode; forming a ferroelectric layer over the dielectric layer and the back gate electrode such that the ferroelectric layer has a monocrystalline region on the back gate electrode, and a polycrystalline region on the dielectric layer and at an edge of the back gate electrode; and forming a channel layer over the ferroelectric layer such that the monocrystalline region is located between the back gate electrode and the channel layer, and the polycrystalline region is located between the dielectric layer and the channel layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a ferroelectric material layer on a channel layer;
    forming a gate electrode on the ferroelectric material layer; and
    treating the ferroelectric material layer so as to form the ferroelectric material layer into a ferroelectric layer which includes a monocrystalline region between the gate electrode and the channel layer, and a polycrystalline region at an edge of the gate electrode.

2. The method of claim 1, wherein the ferroelectric material layer includes $HfO_2$, hafnium silicate, hafnium zirconate, $BaTiO_3$, $PbTiO_3$, $SrTiO_3$, $CaMnO_3$, $BiFeO_3$, AlScN, AlGaN, AlYN, doped $HfO_2$, lead zirconate titanate, barium strontium titanate, $SrBi_2Ta_2O_9$, or combinations thereof.

3. The method of claim 1, wherein the ferroelectric material layer is in a monocrystalline phase before the treating step.

4. The method of claim 3, wherein the treating step includes:
    amorphizing the ferroelectric material layer exposed from the gate electrode to form an amorphous region; and
    recrystallizing the ferroelectric material layer so as to permit the ferroelectric material layer to be formed into the ferroelectric layer.

5. The method of claim 1, further comprising
    forming two spacers at two opposite sides of the gate electrode,
    wherein, in the treating step, the ferroelectric material layer is treated to form the ferroelectric layer with two of the polycrystalline regions each of which is located between the channel layer and a respective one of the spacers.

6. The method of claim 5, further comprising
    forming two source/drain contacts which are located at the two opposite sides of the gate electrode, and which are in electrical contact with the channel layer.

7. A method for manufacturing a semiconductor device, comprising:
    forming a dielectric layer;
    forming a back gate electrode;
    forming a ferroelectric layer over the dielectric layer and the back gate electrode such that the ferroelectric layer has a monocrystalline region on the back gate electrode, and a polycrystalline region on the dielectric layer and at an edge of the back gate electrode; and
    forming a channel layer over the ferroelectric layer such that the monocrystalline region is located between the back gate electrode and the channel layer, and the polycrystalline region is located between the dielectric layer and the channel layer.

8. The method of claim 7, wherein the back gate electrode is formed in and exposed from the dielectric layer.

9. The method of claim 7, wherein the back gate electrode is formed on the dielectric layer.

10. The method of claim 7, wherein the formation of the ferroelectric layer includes:
    forming a ferroelectric material layer over the dielectric layer and the back gate electrode, the ferroelectric material layer being formed in a monocrystalline phase;
    forming a patterned mask on the ferroelectric material layer so as to cover a portion of the ferroelectric material layer in a position above the back gate electrode;
    amorphizing the ferroelectric material layer exposed from the patterned mask; and
    recrystallizing the ferroelectric material layer so as to obtain the ferroelectric layer with the monocrystalline region and the polycrystalline region.

11. A method for manufacturing a semiconductor device, comprising:
    forming a gate electrode;
    forming a channel layer; and
    forming a ferroelectric layer including a monocrystalline region located between the gate electrode and the channel layer, and two polycrystalline regions located at two opposite sides of the monocrystalline region and at two opposite edges of the gate electrode.

12. The method of claim 11, wherein forming the ferroelectric layer includes:
    forming a ferroelectric material layer with a monocrystalline phase; and treating the ferroelectric material layer so as to form the polycrystalline regions at the two opposite edges of the gate electrode.

13. The method of claim 12, wherein treating the ferroelectric material layer includes:
   amorphizing two parts of the ferroelectric material layer to form two amorphous regions; and
   recrystallizing the ferroelectric material layer so as to form the amorphous regions into the polycrystalline regions, thereby forming the ferroelectric material layer into the ferroelectric layer.

14. The method of claim 13, wherein amorphizing the parts of the ferroelectric material layer includes
   introducing ions of an electrically inactive species into the parts of the ferroelectric material layer, thereby forming the amorphous regions.

15. The method of claim 14, wherein the ions of the electrically inactive species include silicon ions, germanium ions, indium ions, xenon ions, argon ions, or combinations thereof.

16. The method of claim 12, further comprising:
   forming two spacers at two opposite sides of the gate electrode such that each of the polycrystalline regions formed after treating the ferroelectric material layer is located between the channel layer and a respective one of the spacers.

17. The method of claim 16, wherein:
   after forming the channel layer, the ferroelectric material layer is formed on the channel layer;
   after forming the ferroelectric material layer, the gate electrode is formed on the ferroelectric material layer; and
   before forming the spacers, two parts of the ferroelectric material layer, which are exposed from the gate electrode, are formed into the two polycrystalline regions after treating the ferroelectric material layer.

18. The method of claim 12, wherein:
   the gate electrode is formed in and exposed from a dielectric layer;
   the ferroelectric material layer is formed on the dielectric layer to cover the gate electrode;
   after treating the ferroelectric material layer, the ferroelectric material layer is formed into the ferroelectric layer having the monocrystalline region in contact with the gate electrode, and the two polycrystalline regions; and
   the channel layer is formed on the ferroelectric layer opposite to the dielectric layer.

19. The method of claim 12, wherein:
   the gate electrode is formed on a dielectric layer;
   the ferroelectric material layer is formed on the dielectric layer to cover the gate electrode;
   after treating the ferroelectric material layer, the ferroelectric material layer is formed into the ferroelectric layer having the monocrystalline region covering the gate electrode, and the two polycrystalline regions at the two opposite edges of the gate electrode and covering the dielectric layer; and
   the channel layer is formed on the ferroelectric layer opposite to the dielectric layer.

20. The method of claim 12, wherein the ferroelectric material layer includes $HfO_2$, hafnium silicate, hafnium zirconate, $BaTiO_3$, $PbTiO_3$, $SrTiO_3$, $CaMnO_3$, $BiFeO_3$, AlScN, AlGaN, AlYN, doped $HfO_2$, lead zirconate titanate, barium strontium titanate, $SrBi_2Ta_2O_9$, or combinations thereof.

* * * * *